(12) United States Patent
Wilson

(10) Patent No.: US 6,728,277 B1
(45) Date of Patent: Apr. 27, 2004

(54) ENVELOPE BIASING FOR LASER TRANSMITTERS

(75) Inventor: Gordon Cook Wilson, San Francisco, CA (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 09/649,279

(22) Filed: Aug. 28, 2000

(51) Int. Cl.[7] ................................................. H01S 3/00
(52) U.S. Cl. ................. 372/38.1; 372/38.01; 372/38.02
(58) Field of Search ............................ 372/38.1, 9, 26, 372/28, 30, 32, 38.01, 38.02; 375/80; 356/28.5; 358/186; 359/125, 118, 132, 161, 187; 455/601, 617, 108; 330/10

(56) References Cited

U.S. PATENT DOCUMENTS

| | | | | |
|---|---|---|---|---|
| 4,403,255 A | * | 9/1983 | Schiff | 358/186 |
| 4,654,889 A | * | 3/1987 | Shutterly | 455/601 |
| 4,715,707 A | * | 12/1987 | Reynolds, III et al. | 356/28.5 |
| 4,759,080 A | | 7/1988 | Emura et al. | |
| 4,831,663 A | * | 5/1989 | Smith | 455/616 |
| 5,056,122 A | * | 10/1991 | Price | 375/80 |
| 5,249,201 A | * | 9/1993 | Posner et al. | 375/59 |
| 5,317,443 A | | 5/1994 | Nishimoto | |
| 5,680,238 A | * | 10/1997 | Masuda | 359/132 |
| 5,831,475 A | * | 11/1998 | Myers et al. | 330/10 |
| 5,850,303 A | | 12/1998 | Yamamoto et al. | |
| 5,867,534 A | * | 2/1999 | Price et al. | 275/286 |
| 5,880,864 A | * | 3/1999 | Williams et al. | 359/118 |
| 5,963,570 A | | 10/1999 | Gnauck et al. | |
| 6,046,797 A | * | 4/2000 | Spencer et al. | 356/73.1 |
| 6,178,026 B1 | * | 1/2001 | Yoshida | 359/187 |
| 6,201,632 B1 | * | 3/2001 | Rollons | 359/259 |
| 6,211,984 B1 | * | 4/2001 | Yoshida | 359/161 |
| 6,256,482 B1 | * | 7/2001 | Raab | 455/108 |
| 6,396,341 B1 | * | 5/2002 | Pehlke | 330/10 |

\* cited by examiner

*Primary Examiner*—Paul Ip
*Assistant Examiner*—Tuan Nguyen
(74) *Attorney, Agent, or Firm*—Christie, Parker & Hale LLP

(57) ABSTRACT

A laser transmitter is configured to use a dynamic bias signal in place of a conventional dc bias current. In particular, the envelope of the applied RF signal is detected and the envelope used to dynamically adjust the laser bias. In this manner, clipping of the laser output is avoided as the value of the RF input is changed.

14 Claims, 4 Drawing Sheets

ENVELOPE BIASING FOR LASER TRANSMITTERS

TECHNICAL FIELD

The present invention relates to a biasing technique for a laser transmitter and, more particularly, to using the envelope of an applied RF signal to dynamically alter the bias current applied to the laser device.

BACKGROUND OF THE INVENTION

Cable TV systems, also known as Community Access Television (CATV) Systems, have evolved from simple broadcast systems for television services to bi-directional broadband networks that can carry voice, video and data traffic. This evolution has been accomplished in part by upgrading traditional cable networks to Hybrid Fiber Cable (HFC) networks which utilize fiber optic systems in conjunction with active electronics and coaxial cables to deliver broadband signals to the home. These networks also support the reception of return path signals, defined as signals generated by units in or near the subscriber and which send data or voice signals from the subscriber or business location to the network through the cable system.

In the common HFC architecture, a fiber optic transmission system is disposed at the head-end and is used to transmit "downstream" (i.e., broadcast) signals toward the various subscribers/business. At predetermined locations, the optical fibers are coupled to sets of coaxial cables, using a "fiber node", where the coax transmission paths then carry the signals along the remainder of the path to the individual locations. On the return path, therefore, the upstream signals first travel along the coax cables and are then combined at the fiber nodes, converted to optical signals, and transmitted up through the remainder of the fiber network to the head-end. A laser transmitter in each fiber node is used to convert the received upstream electrical signal(s) into an optical signal.

In conventional fiber nodes, the bias current applied to an upstream laser is either held constant or automatically adjusted so as to keep the laser output power constant. As mentioned above, upstream rf signals from cable modems, set-top-boxes, and other customer premise equipment all converge on the fiber node as they exit the coax network, where these combined electrical signals are then used to modulate the laser driver in the fiber node. Since the modulating signal level can be quite variable (depending upon the number and strength of the individual return signals), the bias level applied to the laser must be sufficiently high so as to ensure that the modulating signal will not excessively clip the laser. As is well-known in the art, clipping-induced distortion of a laser driver will result in bit errors in the optical output. In the particular broadband communication system environment, the magnitude of the signal modulating the laser will vary rapidly as various modems in the network burst "on" and "off", and will also vary gradually as new channels are allocated or as the physical characteristics of the network change. The variability in the RF signal level can therefore be quite large. Moreover, the RF level of each channel may not be equal and, within a given channel, excessive loss between a particular cable modem and the fiber node may result in bursts from that modem being weaker than those from other modems. Ingress noise can also contribute to the loading of the laser driver in an unpredictable way.

When designing and installing a HFC system, there must be enough "margin" in the laser bias at each fiber node to account for all of these sources of variability in the upstream transmission paths. Accurately characterizing or predicting this variability on a node-by-node basis is not trivial or, in fact, even reliable if the network is subject to constant change by the addition or deletion of customer premise equipment. Thus, even more margin may be built into a chosen bias level to simplify and standardize the system design process, since insufficient margin in the presence of new services may result in unforeseen link degradation (as a result of laser clipping).

The simplistic solution of providing additional margin, however, comes at a cost. The optical modulation depth (OMD) per channel is lowered, and the extra optical power leads to extra relative intensity noise (RIN), as well as shot noise at the receiver. In systems with either optical or RF combining in the upstream, the excess RIN and shot noise from the set of lasers will accumulate. Moreover, in a passive optical network (PON), optical beat interference (OBI) can also be a source of noise if the laser wavelengths overlap, where the OBI noise-power spectral density is proportional to the convolution of the optical spectra. When the OMD is low (as is the case for high margin), the impairment from OBI will be worse. In particular, since the OBI depends on the average optical power in each interfering laser, the carrier-to-noise ratio (CNR) is maximized when the OMD is maximized. Secondly, modulating the laser broadens its linewidth, spreading the OBI spectrum and reducing the noise that falls in any given channel.

Thus, a need remains in the art for an arrangement capable of biasing a laser transmitter (particularly in an HFC broadband network environment) that prevents clipping of the laser, while maintaining the margin at a reasonable level.

SUMMARY OF THE INVENTION

The need remaining in the prior art is addressed by the present invention, which relates to a biasing technique for a laser transmitter and, more particularly, to using the envelope of an applied RF signal to dynamically alter the bias current applied to the laser device.

In accordance with the present invention, an envelope detector is included in a laser transmitter and is responsive to the incoming RF signal. Envelope biasing in accordance with the present invention requires the passband signal modulating the laser to be sub-octave. An up-converter is included in the detector arrangement to shift in the incoming RF signal (in the 5–42 MHz band, for example) by a predetermined carrier frequency $f_c$ into a sub-octave band using single-sideband (SSB) modulation. The laser driver is then biased by a minimal dc amount plus the detected envelope signal, thus providing a dynamic bias that is just sufficient to prevent laser clipping. Alternatively, double-sideband (DSB) modulation may be used to up-convert the received RF signal.

In one embodiment a half-wave rectifier may be used as the envelope detector. Alternatively, a full-wave rectifier circuit may be used. In general, various other embodiments and aspects of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
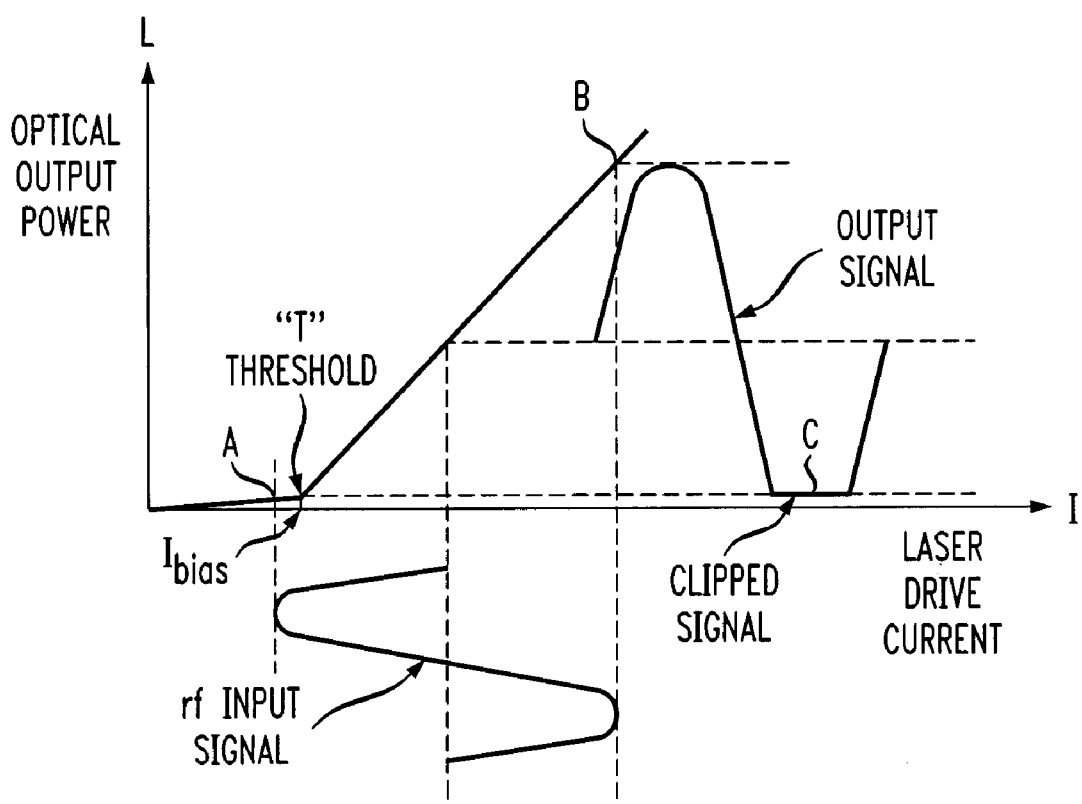
FIG. 1 is an L-I plot of a conventional laser driver, illustrating the presence of clipping in the output.

As discussed above, improper biasing of a laser driver can result in clipping in the transmitter output, particularly in cases where the RF signal applied as an input to the laser can vary as a function of time. The phenomena of "clipping" is illustrated in the graph of FIG. 1, which is a plot of an exemplary laser output as a function of an RF input signal. Shown on FIG. 1 is the plot of the optical output power (L) as a function of the laser drive current (I). The laser threshold point is also indicated on this plot. An applied RF input signal is impressed as shown on the laser drive current. As shown, the swing of this drive signal is large enough to drive the laser below the threshold, denoted as point "A" in FIG. 1. Driving the laser in this fashion thus results in "clipping" the laser output, illustrated as region C in FIG. 1.

Figure 2:
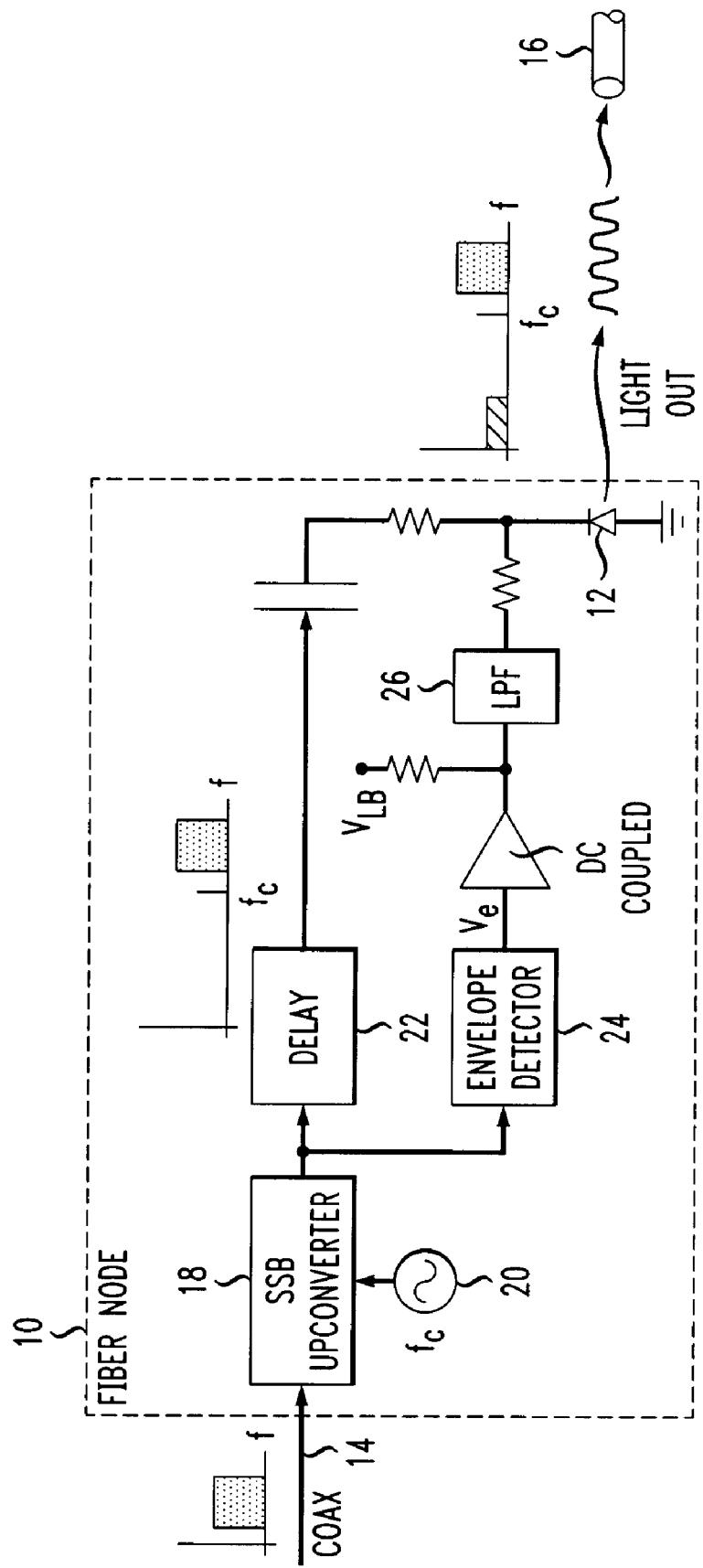
FIG. 2 is a block diagram of an exemplary fiber node formed in accordance with the present invention to include dynamic envelope biasing of the laser driver.

The proposed dynamic envelope biasing arrangement of the present invention, suitable to prevent this type of clipping, is illustrated in FIG. 2. In this particular arrangement, envelope biasing is used in conjunction with a laser transmitter in a fiber node 10. It is to be understood that the envelope biasing arrangement of the present invention is also suitable for use with various other laser transmitter applications, including but not limited to fiber feeds for antennas in wireless communication or radar systems. Within the CATV environment, envelope biasing may also be useful for downstream delivery of narrowcast signals. Referring to FIG. 2, fiber node 10 includes a semiconductor laser 12 which is responsive to an RF input signal v(t) along a coax input line 14. Laser 12 then converts this RF input signal into an optical output signal and couples this optical output into an output transmission fiber 16.

In accordance with the present invention, envelope biasing of laser 12 requires the passband signal modulating laser 12 to be sub-octave. Therefore, an up-converter 18 is required to convert input RF signal v(t) in the 5–42 MHz band by a predetermined carrier frequency $f_c$ into a sub-octave band, using single-sideband (SSB) modulation. The modulation frequency $f_c$ is provided, as shown, from an oscillation source 20. The resulting bandpass signal output from up-converter 18 can then be expressed as follows:

$$v_c(t) = \frac{A_c}{2}[\alpha\cos\omega_c t + v(t)\cos\omega_c t - v_h(t)\sin\omega_c t],$$

where $v_h(t)$ is the Hilbert transform of v(t). The term $(\alpha A_c/2) \cos \omega_c(t)$ is defined as the small residual carrier, which simplifies synchronous detection at the receiver. The signal $v_c(t)$, provided as the output from up-converter 18, subsequently passes through a delay element 22 before being applied as the modulating input to laser 12. In accordance with the present invention, output signal $v_c(t)$ from up-converter 18 is also applied as an input to envelope detector 24, where the details of different particular envelope detector arrangements will be discussed below in association with FIGS. 3 and 4. Referring back to FIG. 2, laser 12 is shown as biased by only a small dc value ($I_B$), necessary to achieve threshold, plus a dynamically varying current y(t) that is derived from the detected envelope of the RF input signal. That is, the total bias signal applied to the laser can be represented by the following expression:

$$i(t)=I_B+y(t)+v_c(t)$$

The current y(t) is approximately equal to $v_e(t)$, the envelope of $v_c(t)$. y(t) is a baseband signal, below the bandpass signal $v_c(t)$ and can be used as an approximation of $v_e(t)$. At the receiver (not shown), the detected signal can be high-pass filtered to recover $v_c(t)$ alone, or each demodulator can simply bandpass filter the total signal to isolate a single channel. Using this dynamic bias signal y(t) instead of a constant value, the average optical power is lowered, thereby reducing both RIN and shot noise.

For AM input signals, the envelope of the bandpass signal is exactly the low pass signal prior to up-conversion. However, for suppressed-carrier modulation techniques such as double-sideband (DSB) or SSB modulation, this is not the case. In particular, for DSB, the envelope is given by $v_e(t)=|v(t)|$. This signal has more high frequency content than v(t) due to downward spikes in $v_e(t)$ at v(t)=0. For the purposes of the present invention, dynamic bias signal y(t) need not exactly track the downward spikes of $v_e(t)$. Indeed, clipping will be avoided as long as $y(t)>v_e(t)$. This is accomplished fairly well as long as y(t) is allowed to have a bandwidth equal to twice the highest frequency component of v(t).

In the case of single sideband (SSB) modulation, the envelope signal $v_e(t)$ can be defined as follows:

$$v_e(t)=(A_c/2)\sqrt{v^2(t)+v_h^2(t)}$$

Provided that $v_h(t)$ is of comparable smoothness to v(t), this envelope will vary more smoothly than the envelope of a DSB signal and the bandwidth of $v_e(t)$ will be roughly the same as v(t). In general, the bandwidth of a bandpass signal and its envelope are roughly the same, which can be understood by considering that the envelope is formed by the carriers in the bandpass signal beating amongst themselves. The bandwidth of the envelope is thus limited to the difference in frequency between the highest and the lowest carrier frequencies. Since a DSB signal occupies at least twice the spectrum as a SSB signal, its envelope also occupies at least twice the spectrum.

Figure 3:
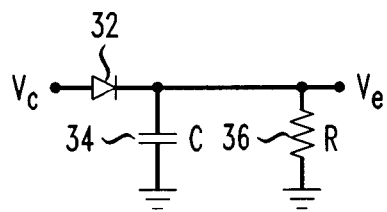
FIG. 3 illustrates an exemplary envelope detector for use in the fiber node of FIG. 2.

FIG. 3 illustrates a relatively simply envelope detector 30 useful as in the envelope biasing arrangement of the present invention. As shown, the up-converted RF signal $v_c(t)$ is applied as an input to a diode 32 within detector 30. Diode 32, in an exemplary embodiment, comprises a zero-bias Schottky detector diode with low junction capacitance. A parallel RC circuit comprising a capacitor 34 and resistor 36 provides a time constant that allows for the envelope of input signal $v_c(t)$ to be extracted and thus form output signal $v_e(t)$. Since the up-conversion carrier frequency $f_c$ may be only a few times larger than the highest frequency component of $v_c(t)$, capacitor 34 will partially discharge between oscillations at carrier frequency $f_c$. As a result, output signal $v_e(t)$ will contain high frequency artifacts around $f_c$. If these artifacts become problematic, a low pass filter may be used to remove them. Referring back to FIG. 2, a low pass filter 26 is included in signal path between envelope detector 24 and laser diode 12 to remove these artifacts. As a result, the applied bias signal y(t) will be a somewhat distorted representation of the envelope. However, since the bias signal need not track the envelope exactly, this degree of distortion can be tolerated.

Figure 4:
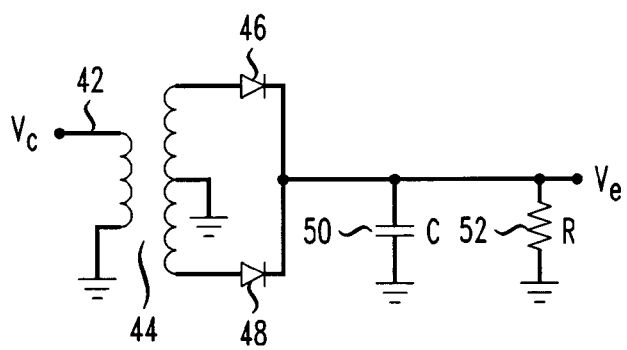
FIG. 4 illustrates an alternative envelope detector that may be used in the arrangement of FIG. 2.

FIG. 4 illustrates an alternative envelope detector arrangement 40 in the form of a full-wave rectifier that may be used to provide dynamic laser biasing in accordance with the present invention. In this embodiment, input up-converted RF signal $v_c(t)$ is applied as an input to a primary winding 42 of a center-grounded transformer 44, thus providing balanced RF signals as inputs to a pair of Schottky diodes 46 and 48 (the outputs being 180° out of phase). The outputs from both diodes 46 and 48 are then applied as an input to the parallel RC circuit comprising a capacitor 50 and resistor 52. In this embodiment, the envelope output $v_e(t)$ will be smoother, since the RC time constant of the load can be half of that associated with envelope detector 30 of FIG. 3. Moreover, since the time constant can be halved, the output will more accurately track rapid fluctuations in the envelope. Input transformer 44 can also be used to step up the voltage applied to diodes 46,48 and thus further reduce distortion. In both envelope detectors 30 and 40, the combination of the capacitor, junction capacitance of the diodes, low pass filter and propagation delay will shift and distort the phase of y(t). The delay can be matched by controlling the value of delay element 22 in the main signal path.

Figure 5:
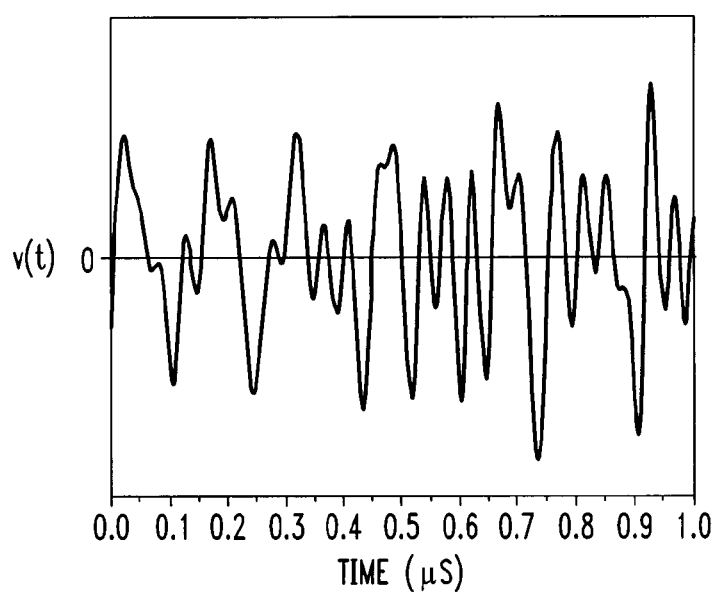
FIG. 5 illustrates a 1 μsec segment of an exemplary upstream RF signal utilized as an input to a laser driver within a fiber node.
Figure 6:
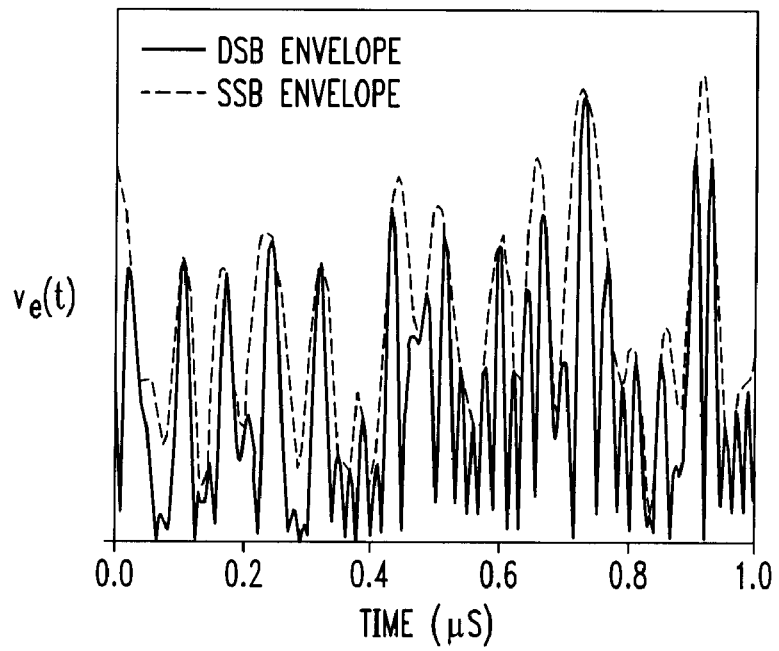
FIG. 6 is a graph of the detected envelopes (both SSB and DSB) for the signal of FIG. 5.
Figure 7:
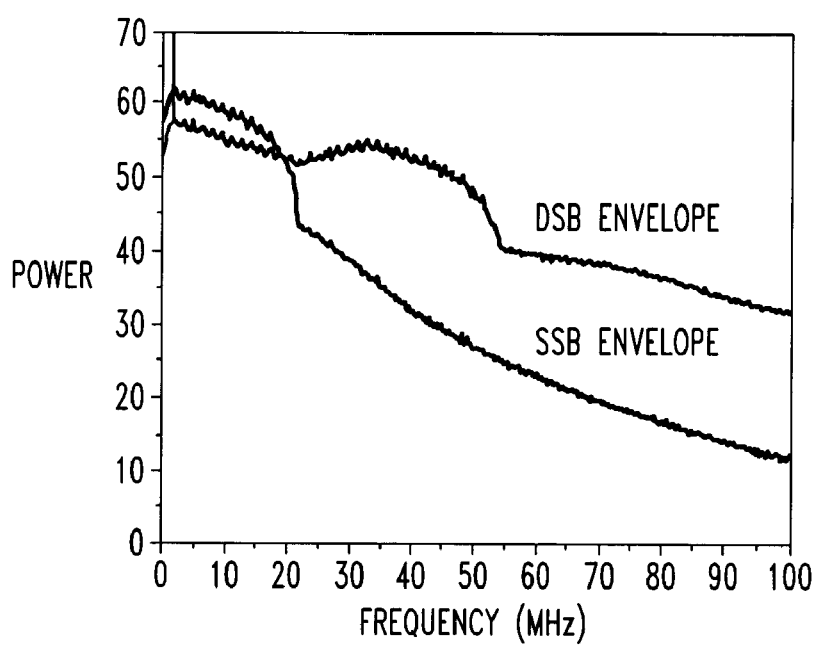
FIG. 7 is a graph illustrating the bandwidth of the SSB and DSB envelopes of FIG. 6.

In a simulation of the performance of envelope biasing of a laser transmitter in a fiber node, an input signal v(t) representing return RF signals on fourteen separate channels was formed using a random process, where a 1 μsec segment of this signal is illustrated in FIG. 5, where this signal comprises a channel spacing of 1.45 MHz and a symbol rate of 1.28 Mbaud per channel. The associated envelope $v_e(t)$ for a bandpass version of this signal is shown in FIG. 6, for both SSB and DSB modulations. As predicted, the envelope of the SSB signal is more smoothly varying and, as shown in FIG. 7, its bandwidth is less than half that of the DSB envelope.

If it is assumed that the laser diode is perfectly linear above threshold, then the output optical power can be written $P(t)=y(I(t)-I_{th})$ where $I_{th}$ is the threshold current and y is defined as the slope efficiency. An effective rms modulation depth can then be defined as follows:

$$\mu_{eff} = \frac{\sqrt{\langle P(t)^2 \rangle - \langle P(t) \rangle^2}}{\langle P(t) \rangle}$$

Assuming that $I_B=I_{th}$, then the expression can be simplified to the following:

$$\mu_{eff} = \frac{\sqrt{\langle v(t)^2 \rangle}}{\langle v_e(t) \rangle}$$

since <v(t)>=0. A numerical simulation shows that $\mu_{eff}$= 3.32 for DSB and $\mu_{eff}$=2.12 for SSB. With conventional prior art dc biasing of an upstream laser, the rms modulation depth is chosen such that μ<0.3 to minimize clipping distortion. Thus, envelope biasing in accordance with the present invention yields approximately an 8.5 dB increase in $\mu_{eff}$.

While envelope biasing reduces the average received optical power for a given RF signal level, it does not reduce the "peak" optical power. The peak optical power is limited by the output saturation characteristics of the laser and, potentially, by optical nonlinearities in the transmission fiber. However, the utilization of envelope biasing in accordance with the present invention will allow for an increase in the dynamic range of an upstream laser located in a fiber node of an HFC system. In most conventional HFC architectures, as mentioned above, shot noise and RIN are the dominant noise sources. Since envelope biasing significantly reduces these noise sources, the carrier-to-noise ratio (CNR) of the received signal is greatly improved for a given level of modulation. Moreover, since envelope biasing prevents clipping, the laser can be driven harder. The nonlinearity of the laser above threshold now limits the modulation, not the clipping.

Various other problems, primarily associated with the use of lasers in an upstream fiber node, are reduced or eliminated by the use of envelope biasing. For example, since the average laser current (i.e., the dc bias current) is greatly reduced, the laser operates at a cooler temperature, and intracavity and facet optical powers are reduced, thus extending laser lifetime. Link budgets can also be increased due to the decrease in shot noise and RIN. Ingress-induces laser clipping is also obviously eliminated by using dynamic biasing. Various other improvements exist, all as a result of envelope biasing in accordance with the present invention. In general, the spirit and scope of the present invention is intended to be limited only by the claims as appended hereto.

What is claimed is:

1. A laser transmitter arrangement comprising
   a laser diode for receiving as separate inputs an RF input signal and a laser bias signal;
   an up-converting modulator responsive to an RF message signal and a modulator signal at a predetermined carrier frequency $f_c$ for providing as an output an up-converted message signal $v_c(t)$, said up-converted message signal applied as the RF input signal to said laser diode; and
   an envelope detecting arrangement disposed to receive as an input the up-converted message signal $v_c(t)$ and generating as an output an envelope signal $v_e(t)$ of up-converted message signal v(t) and applying said envelope signal $v_e(t)$ as the laser bias current input to the laser diode.

2. A laser transmitter arrangement as defined in claim 1 wherein the arrangement further comprises a low pass filter disposed in the signal path between the envelope detecting arrangement and the laser diode bias signal input.

3. A laser transmitter arrangement as defined in claim 1 wherein the arrangement further comprises a delay element disposed in the signal path between the up-converter and the RF signal input of the laser diode.

4. A laser transmitter arrangement as defined in claim 1 wherein the envelope detecting arrangement comprises a diode coupled to a parallel arrangement of a resistor and a capacitor.

5. A laser transmitter arrangement as defined in claim 4 wherein the diode comprises a zero-bias Schottky detector.

6. A laser transmitter arrangement as defined in claim 1 wherein the envelope detecting arrangement comprises a full-wave rectifier.

7. A laser transmitter arrangement as defined in claim 6 wherein the full-wave rectifier comprises
   a center-grounded transformer including a primary winding and a pair of parallel secondary windings, the up-converted RF signal applied as an input to the primary winding;
   a pair of diodes, each diode disposed in the output path of a separate one of the pair of secondary windings; and
   a parallel resistor-capacitor arrangement coupled to both diodes.

8. In a hybrid fiber coax network, a fiber node for transmitting communication signals between an optical fiber disposed upstream of the fiber node to a head end in said hybrid fiber coax network and a coaxial disposed downstream of said fiber node to a plurality of subscribers in said network, said fiber node comprising an upstream laser driver for converting a plurality of RF electrical signals from the plurality of subscribers into an optical signal and coupling said optical signal into the upstream optical fiber, said laser driver further responsive to a laser bias current;

an up-converting modulator responsive to said plurality of RF electrical signals from said plurality of subscribers and also responsive to a modulator signal at a predetermined carrier frequency $f_c$ for generating as an output an up-converted signal $v_c(t)$ said up-converted signal applied as the RF input to said laser driver; and an envelope detecting arrangement disposed to receive as an input the up-converted signal $v_c(t)$ and generating as an output an envelope signal $v_e(t)$ and applying said envelope signal as the laser bias signal input to said laser driver.

9. A fiber node as defined in claim 8 wherein the node further comprises a low pass filter disposed in the signal path between the envelope detecting arrangement and the laser diode bias signal input.

10. A fiber node as defined in claim 8 wherein the node further comprises a delay element disposed in the signal path between the up-converter and the RF signal input of the laser diode.

11. A fiber node as defined in claim 8 wherein the envelope detecting arrangement comprises a diode coupled to a parallel arrangement of a resistor and a capacitor.

12. A fiber node as defined in claim 11 wherein the diode comprises a zero-bias Schottky detector.

13. A fiber node as defined in claim 8 wherein the envelope detecting arrangement comprises a full-wave rectifier.

14. A fiber node as defined in claim 13 wherein the full-wave rectifier comprises a center-grounded transformer including a primary winding and a pair of parallel secondary windings, the up-converted RF signal applied as an input to the primary winding;

a pair of diodes, each diode disposed in the output path of a separate one of the pair of secondary windings; and a parallel resistor-capacitor arrangement coupled to both diodes.

* * * * *

UNITED STATES PATENT AND TRADEMARK OFFICE
CERTIFICATE OF CORRECTION

PATENT NO. : 6,728,277 B1 Page 1 of 1
APPLICATION NO. : 09/649279
DATED : April 27, 2004
INVENTOR(S) : Wilson It is certified that error appears in the above-identified patent and that said Letters Patent is hereby corrected as shown below:

Column 6, line 37, Claim 1        Delete "v(t)",
                                  Insert --$v_c(t)$--

Column 7, line 16, Claim 8        After "$v_c(t)$",
                                  Insert --,--

Signed and Sealed this

Twenty-fifth Day of July, 2006

JON W. DUDAS
*Director of the United States Patent and Trademark Office*